6/1/82 XR 4,333,028

United States Patent [19]

Panton

[11] 4,333,028

[45] Jun. 1, 1982

[54] DAMPED ACOUSTIC TRANSDUCERS WITH PIEZOELECTRIC DRIVERS

[75] Inventor: Stanley Panton, Peterborough, Canada

[73] Assignee: Milltronics Ltd., Peterborough, Canada

[21] Appl. No.: 243,490

[22] Filed: Mar. 13, 1981

Related U.S. Application Data

[63] Continuation-in-part of Ser. No. 142,014, Apr. 21, 1980.

[51] Int. Cl.[3] .............. H01L 41/08

[52] U.S. Cl. .............. 310/326; 310/322; 310/334; 310/335; 310/321; 310/312

[58] Field of Search .............. 310/322–324, 310/326, 327, 334, 335, 312; 179/110 A; 181/164–167

[56] References Cited

U.S. PATENT DOCUMENTS

| | | | |
|---|---|---|---|
| 1,693,727 | 12/1928 | Pape | 181/167 X |
| 3,578,104 | 5/1971 | Sotome | 181/164 |
| 3,674,945 | 7/1972 | Hands | 310/334 |
| 3,777,192 | 12/1973 | Barrow | 310/312 |
| 3,804,329 | 4/1974 | Martner | 310/324 X |
| 3,849,679 | 11/1974 | Massa | 310/324 |
| 3,890,513 | 6/1975 | Barleen | 310/324 |
| 3,891,869 | 6/1975 | Scarpa | 310/321 |
| 4,078,160 | 3/1978 | Bost | 179/110 A |
| 4,190,784 | 2/1980 | Massa | 310/324 |

FOREIGN PATENT DOCUMENTS 1546591 11/1968 France .

OTHER PUBLICATIONS

"An Ultrasonic Transducer for High Power Applications in Gases," by Gallego-Juarez et al., *Ultrasonics*, Nov. 1978.

"Ultrasonic Apparatus" by Havant, *Research Disclosures Product*, Licensing Index, Jun. 1971, No. 86, (British).

*Primary Examiner*—Mark O. Budd

*Attorney, Agent, or Firm*—Ridout & Maybee

[57] ABSTRACT

A tuned acoustic directional transducer for transmitting and receiving airborne sound, which provides enhanced efficiency and reduced cost without undue narrowing of bandwidth, makes use of an acoustic transducer element (2) coupled to a plate (10) having a higher order flexural mode resonance at approximately the desired frequency of operation, the plate being coupled to the air through low-hysteresis acoustic propagation material having an acoustic impedance much less than that of the plate and much greater than that of the air. The material is disposed so that in the desired direction of propagation there is no substantial reduction of sound intensity in the far field resulting from cancellation occasioned by interaction of sound radiated from adjacent antinodal zones. Preferably the thickness of the material is such that it acts as an efficient acoustic impedance matching transformer. Preferably, the transducer element is piezoelectric and coupled to the center of a circular plate to which the coupling material is applied in rings (16, 18, 20).

25 Claims, 4 Drawing Figures

DAMPED ACOUSTIC TRANSDUCERS WITH PIEZOELECTRIC DRIVERS

REFERENCE TO RELATED APPLICATION

This application is a continuation-in-part of my co-pending Application No. 142,014 filed Apr. 21, 1980.

FIELD OF THE INVENTION

This invention relates to acoustic transducers, and more particularly the coupling of a tuned transducer element to a low impedance medium in which sound waves are to be propagated to or from the transducer. More particularly, the invention is concerned with transducer systems suitable for example for use in pulse-echo ranging applications in which it is desirable to combine high coupling efficiency and highly directional characteristics with a relatively low transducer "Q".

BACKGROUND OF THE INVENTION AND PRIOR ART STATEMENT

Transducers of the type with which the present application is concerned are utilized for the conversion of acoustic energy into or from another form of energy, usually electrical energy, and depend upon the vibration of a mechanical element of relatively high acoustic impedance being converted into or generated from said other form of energy. In a practical system, to or from which acoustic energy is to be transmitted or received, this medium typically being air which has a very low acoustic impedance. The nature of this coupling determines the efficiency of the system, its frequency response, and the directionality of the propagation of the energy in the medium.

One widely used form of acoustic transducer assembly utilizes an axially deformable cylindrical element such as a piezoelectric crystal held in an open end of a cylindrical support such as a tube. Sound waves emanate from the end, or radiating aperture, of the tube when the outer end surface of the element vibrates in response to an excitation of the element as by electrical stimulation. Such a transducer assembly is commonly utilized for transmission and/or reception of sound in a gaseous medium, the sound usually being of a high frequency such that the sound wavelength in the medium is smaller than the dimensions of the radiating aperture.

The radiation pattern of sound emitted from such a transducer approximates that of a plane circular piston operating within an infinite baffle. It is well known that the directivity of such a transducer is a function of the ratio of the diameter of the radiator to the sound wavelength in the propagating medium, so that a radiator of larger diameter will exhibit a higher degree of directivity than will one of smaller diameter while propagating waves of the same length into the same medium. Thus, for a given directivity, a lower sound frequency requires a larger transducer element.

Of particular interest is the acoustic power and bandwidth of sound radiated from a transducer such as that described above. A major and well known problem exists in the transmission of sound between a gaseous medium of low acoustic impedance and a high impedance acoustic transducer assembly such as that abovementioned. The problem is present irrespectively of whether the sound is radiated from the transducer assembly into the medium or from the medium into the transducer assembly, and is manifested by a substantially reduced coupling and bandwidth of the acoustic energy transferred between the source and the medium. In the case of a piezoelectric crystal and an air environment the difference in impedance is enormous, being of the order of 10,000 to one or greater.

The essence of the coupling problem is that the low impedance gaseous environment offers very little opposition to the motion of the high impedance piezoelectric crystal so that little work is done by the crystal in imparting motion to the gaseous environment.

A well known means whereby the crystal may be made to do more work on, and thereby impart more energy into a gaseous medium is to arrange that the crystal be stimulated at one of its natural resonant frequencies thereby causing the motion of the crystal surfaces to be greater by a factor of ten or twenty or more times. In such manner, the same crystal surface area works against the same opposition offered by the gaseous environment but through a much greater distance each time the crystal surface moves through one cycle of its motion. More work is therefore done and more energy is imparted to the gaseous environment for each cycle of motion of the crystal surface. Even then, comparatively little power is transferred to the medium, and since there is little damping of the crystal oscillation, the bandwidth is very narrow and the resultant ringing effect makes it impossible to transmit and receive sharply defined pulses of sound energy with very short attack and decay times.

Another well known means whereby the crystal may be made to do more work on, and thereby impart more energy to a gaseous medium is to place an intermediate structure such as a rigid cone or diaphragm, whose frontal dimension is greater than that of the crystal, between the crystal and the gaseous environment. Such an arrangement suitably constructed according to well known principles results in a greater area (according to the ratio of the frontal area of the cone or diaphragm to that of the crystal) of the gaseous environment being displaced by the motion of the crystal. Accordingly, a larger area moving through the same distance against the same opposition offered by the gaseous environment results in more work being done by the crystal than would be the case if the crystal were operated without benefit of the intermediate structure. Depending upon the mass and rigidity of the cone or diaphragm, the performance of the device can be influenced in various ways, but if a highly directional output is required, only a modest improvement in output can be achieved, since the size of the diaphragm is limited by the necessity for maintaining a coherent wavefront and a gross impedance mismatch remains.

A third well known means whereby the vibrating element may be made to do more work on, and thereby impart more energy into a gaseous medium is to place one or more impedance transforming transmission line sections between the crystal and the gaseous environment. This latter method of impedance matching has been fully described in U.S. Pat. No. 3,674,945 issued July 4, 1972 to Hands for "Acoustic Matching System". The operation of this latter method depends upon the acoustical properties of the matching section or sections which are placed between the high impedance crystal and the low impedance gaseous medium and upon those of the crystal and the gaseous environment themselves. The effect of a properly devised matching structure of this type is that it allows the motion at the interface between the structure and the gaseous environment to be much greater than the motion at its opposite end at the interface between the structure and the crystal surface. Thus a short powerful stroke at the high impedance end of the structure, at the crystal face, is transformed into a much longer but less forceful stroke at the low impedance end of the structure at the interface with the gaseous medium.

The severity of the impedance mismatch between a piezoelectric crystal and a medium such as air is readily demonstrated. For example, in the case of a piezoelectric crystal being utilized without a matching structure for transmission of sound power into air, the crystal may have to be driven at such large amplitudes of pulsation that the crystal may fracture, while with the insertion of some form of matching structure between the crystal and the air environment, the same sound power can be transmitted into the air by driving the crystal at substantially reduced amplitudes of pulsation which do not induce crystal fracture.

It should be noted that while the aforementioned use of a structure, constituting sections of acoustical transmission line so chosen as to effect an impedance match between the high impedance crystal and a low impedance air environment, does provide improvement in sound transmission as compared to the absence of any such matching structure, nevertheless, the efficiency of the arrangement remains extremely low, and the degree of coupling to the medium is not high enough to provide any significant damping of the oscillation of the crystal which must therefore be damped by other means if a widened bandwidth is required.

Proposals have been made to match the impedance of a high impedance driving source such as a piezoelectric crystal to a lower impedance environment such as air by the use of an intermediate structure embodying a vibrating plate or disc, but it has not been possible heretofore to achieve such a match without sacrificing directionality and/or bandwidth.

An example of such a proposal is provided by Scarpa U.S. Pat. No. 3,891,869 issued June 24, 1975, wherein there is disclosed an acoustic transducer assembly including a driving element comprising a piezoelectric generator in the form of a disc with a high mass backing element bonded to one face and an acoustic wave transformer bonded to the other. The wave transformer element varies in cross-section in an axial direction, comprising discs of maximum dimension at the generator face and at the radiating face. Beginning at line 48, column 2 of the disclosure the statement is made that the transformer, including the disc, functions to step down the impedance by increasing the area of contact at the radiating surface, which moves in small arc vibrations at high velocity.

In the device described in the Scarpa patent, a highly directional field of sound emission is not a requirement. In point of fact, a main feature of the device is that phase differences across the vibrating disc cause the central lobe of radiation to be suppressed, and cause the side lobes to be enhanced to the point that a major portion of the energy radiated is radiated away at an angle of about 45 degrees to the main axis of the device.

Another prior art proposal is described in a paper by J. A. Gallego-Juarez, G. Rodriguez-Corral and L. Gaete—Garreton, published in the November, 1978 issue of Ultrasonics.

In that paper there is described a transducer utilizing a stepped vibrating plate to effect an impedance match between a source of ultrasound vibrations and a gaseous environment, whilst providing highly directional radiation. Although an effective impedance match is obtained by the device its bandwidth is extremely narrow, typically being about 10 hertz for a device operating at about 20,000 hertz corresponding to a Q of about 2,000. A device with such a high Q is suitable for production of continuous sound at a fixed frequency, but is not suitable for use in pulsed echo-ranging applications where it is necessary that the transducer exhibit a much lower Q providing a bandwidth of at least 5 to 10 percent of the resonant frequency.

Hitherto, transducer systems suitable for pulsed echo-ranging applications in gaseous mediums have been of the type disclosed in U.S. Pat. No. 3,674,945, or more simple and inefficient coupling methods have been used, together with some mechanical and/or electric means for damping the vibrating element thus leading to very low efficiencies. A further problem with such systems arises in applications where a substantial range is required. Since absorption of sound energy by gaseous media increases with frequency, longer ranges require not only greater power but lower frequencies, and this means that to obtain the required directionality and power output, larger transducer elements must be used. The piezoelectric materials widely used for such elements are both expensive and massive, and whilst it would be entirely possible to produce a transducer system in according with U.S. Pat. No. 3,674,945 which will perform satisfactorily at 10 kHz, the mass and cost of such a system would be excessive for normal commercial applications.

According to the invention a broadly tuned directional acoustic transducer system comprises a plate having a radiating surface and a higher flexural mode resonance at substantially the operating frequency of the system, and a transducer element of much smaller effective area than the radiating surface of the plate and connected thereto for excitation or response to said higher flexural mode resonance, wherein at least alternate antinodal zones of the radiating surface of the plate are coupled to a gaseous propagation medium by means formed to low-loss acoustic propagation material of much lower acoustic impedance than the plate and applied at least to said alternate antinodal zones of the radiating surface thereof in a thickness selected to differentiate at least one of the relative phase and the relative amplitude of the radiation from adjacent antinodal zones sufficiently to reduce substantially mutual cancellation, in the far field and in the desired direction of radiation, of sound radiated into said medium from adjacent antinodal zones of the plate. Preferably the plate is axisymmetrically resonant and in presently preferred forms of the invention a disc shaped plate is used coupled axially to the transducer element, the axis of the plate and the disc also being the directional axis of the system. With a disc shaped plate, the covering material is arranged in concentric rings covering adjacent antinodal zones, the thickness of adjacent rings being different so as to produce coherency of radiation in the axial far field. In one embodiment of the invention the thickness of material covering alternate zones is zero, i.e. alternate zones are uncovered. The matching into the propagation medium from the covered zones can thus either be made so much better than that from the uncovered zones that substantially no phase cancellation occurs in the axial far field, or sufficient phase shift can be introduced in sound radiated from the covered zones to substantially reduce cancellation. Alternatively the whole radiating surface of the plate may be covered by material, of thickness such that there is both phase shift of radiation from alternate zones, and acoustic impedance matching between the plate and the propagation medium, usually air. The covering material need not be uniform, and adjacent zones could be covered by different material, or the material could comprise layers of different materials or have graded properties provided that the desired phase and/or amplitude modification is achieved. The improved coupling of the system to the medium damps the system thus reducing its Q and rendering it capable of use in echo-ranging techniques without external damping.

The invention is further described with reference to the accompanying drawings, in which.

Figure 1:
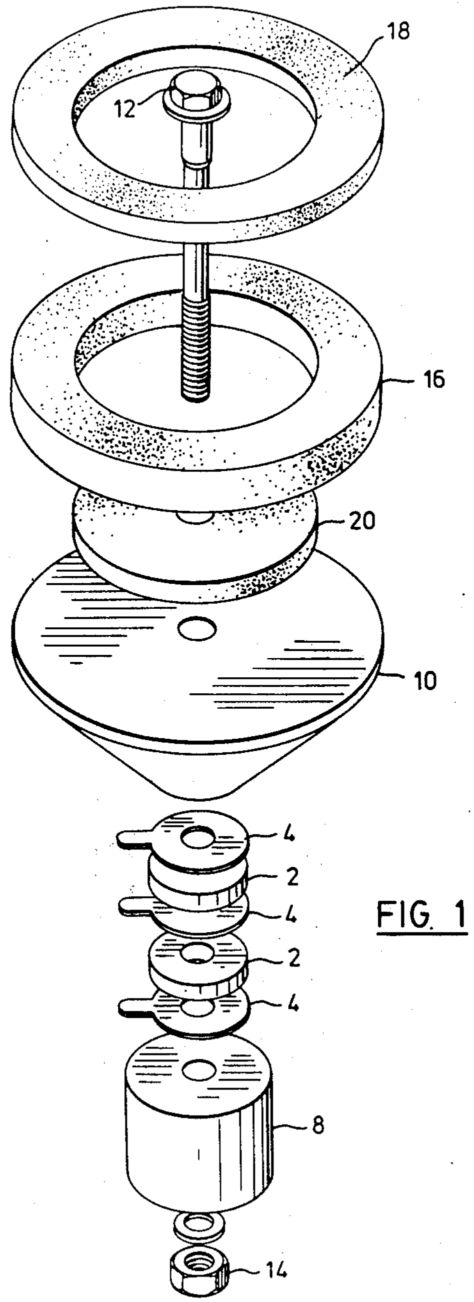
FIG. 1 is an exploded perspective view of a first embodiment of the invention without its protective housing.

Referring first to FIG. 1, a directional transducer system suitable for transmitting and receiving pulses of sound at a predetermined frequency comprises a pair of piezoelectric crystal elements 2 operating mechanically in series in an axial compressive mode, electrical contact with the ends of the elements being made through lugs on conductive brass washers 4. The elements may be of lead zirconate titanate or other suitable piezoelectric material and connected to a winding of a suitable electrical matching transformer 6 (see FIG. 3) through which electrical signals are transferred to and from the transducer.

The elements 2 and their connection washers 4 are sandwiched between a loading block 8 and a plate 10 which is disc shaped with an inverted conical configuration, being thicker in the middle, the entire assembly being held together by a through bolt 12 and a nut 14. The diameter of the plate 10 is much greater than that of the elements 2, and the material and dimensions of the plate are selected so that it exhibits a higher flexural mode resonance, exhibiting in the case under consideration a single nodal circle, at a frequency close to the desired frequency of operation. In this mode of resonance, the zones of the plate inside and outside the nodal circle are moving in antiphase.

Attached to the zone of the upper surface of the plate outside the nodal circle is a ring 16 of lower density elastic material, typically closed-cell polystyrene or other synthetic plastic or rubber foam, or non-foamed resilient synthetic plastic such as polyurethane. The material should be such as to allow propagation of the sound waves with low losses, i.e. it should exhibit low hysteresis as an acoustic propagation medium. The thickness of this ring is discussed further below but is such that sound waves passing through it from the plate undergo a phase reversal as compared to waves passing through a similar thickness of air. (It is assumed for convenience that the system is operating in air, and this will normally be the case, but it will be understood that the invention is equally applicable to systems operating in other gaseous media).

In a preferred arrangement, further rings 18, 20 of low density, low hysteresis acoustic propagation material, which may be the same as or different to that of the ring 16, are applied over the ring 16, and within the nodal circle. These rings have a common thickness which is an integral odd number of quarter wavelengths of sound at the operating frequency in the material of the rings so as to provide acoustic impedance transformation between the plate and the adjacent air.

Figure 2:
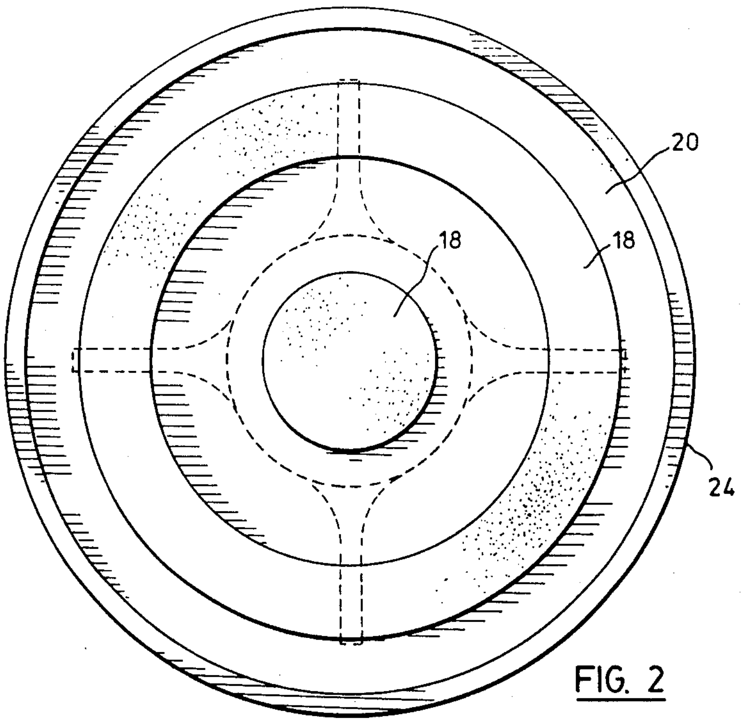
FIG. 2 is a plan view of a second embodiment of the invention, supported in a protective housing.
Figure 3:
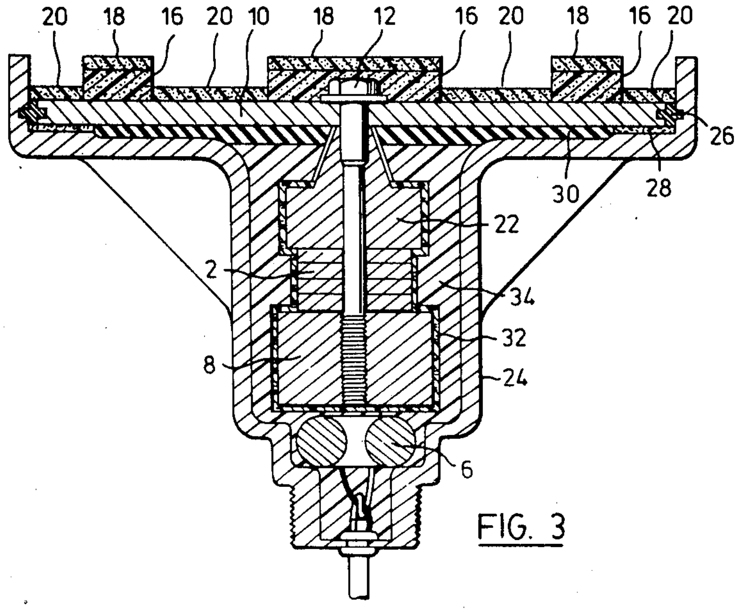
FIG. 3 is an axial section through the embodiment of FIG. 2.

In the embodiment shown in FIGS. 2 and 3, parts functionally similar to those of FIG. 1 carry the same reference numerals. The plate 10 is of uniform thickness, which both simplifies manufacture and greatly assists in predicting its resonance characteristics. It is operated in a still higher flexural resonance mode, with three nodal circles, so that the number of rings 16, 18, 20 is correspondingly increased. An additional loading and driving block 22 is provided to couple the transducer elements to the plate 10. The transducer elements 2 are shown as being four in number, but this will depend on the operating frequency required, the piezoelectric material utilized, and the dimensions of the system. The system is enclosed, except for the radiating surface of the plate 10, in a housing 24 in which it is sealed by peripheral polyurethane seal 26 and a felt seal 28. An air space 30 beneath the plate is filled with a foam rubber sound absorber, whilst the transducers and driving blocks are wrapped in cork 32 and surrounded by potting compound 34. It will be understood by those skilled in the art that this packaging of the system can be varied within a wide scope to meet different requirements and environments provided that the proper function of the system is not substantially obstructed.

The operation of the embodiments so far described will be better understood by reference to experiments carried out by the inventor. In all of these experiments, the transducers were driven by a square wave voltage source having an 800 volt peak to peak amplitude in bursts of approximately 2 milliseconds duration. Sound pressure levels were measured in microbars peak-to-peak at a distance of 8 feet from the transducer using an appropriately calibrated Bruel and Kjaer condenser microphone type 4133.

The system shown in FIG. 1 was constructed using a plate 10 of aluminum 12.5 cm in diameter. The system was first tested with the rings 16, 18 and disc 20 omitted, at three different resonant frequencies. At the lowest frequency tested, 7.09 KHz, the plate acted essentially as a piston, and a radiation pattern was observed with fairly good directional properties, the axial lobe having a 3 dB beam width of about 20°, with all side lobes more than 12 dB down, but the coupling into air was poor. The maximum sound pressure level measured occurred on the axis of the transducer and was 120 microbars peak-to-peak. The Q of the system was unacceptably high for pulse echo-ranging applications. At the next resonance of the plate at 15.56 KHz, the plate was radiating essentially in the flexural mode, and the radiation pattern showed only a small central lobe with much larger side lobes, such a pattern being unsuitable for most echo-ranging techniques. The sound pressure level on axis was only 87 whilst that of the first side lobe was 250. Almost all the energy was concentrated in the first and second side lobes. At a frequency of 33.5 KHz, corresponding to a higher order flexural mode, the radiation pattern had deteriorated still further, and the sound pressure levels of the first and second side lobes were 140 and 125 respectively.

Application of the ring 16, which is of insulation grade polystyrene foam, 14.3 mm thick and 19 mm wide, resulted in slight alteration of the second of the two resonant frequencies discussed above to 16.07 KHz, but a striking change in the radiation pattern which became excellent with a 3 dB beam width of 10° and all side lobes more than 12 dB down. The maximum sound pressure level was once more on the transducer axis and increased to 550. The ring 16 was calculated, as discussed below, to provide a 180 degree phase reversal of sound radiated from the part of the disc outside the nodal circle, the position of which was determined visually by conventional means.

When the discs 18 and 20 were added, these being of low density polyethylene foam 6.7 mm thick (corresponding to a quarter wavelength at the resonant frequency) the performance of the system showed a further substantial improvement. The resonant frequency altered slightly to 15.83 KHz, and the 3 dB beam width broadened slightly to 12.5°, but all the side lobes were more than 18 dB shown and the maximum second pressure level increased to 1700. The coupling to the medium was improved to a point at which the damping was more than adequate for pulse echo-ranging techniques. In an echo test, the amplitude of the electrical signal output from the transducer system due to receipt of an echo returned from a hard target at different distances was as follows: from 1.5 meters, 2.5 volts peak-to-peak, from 2.25 meters, 1.60 volts peak-to-peak; from 3 meters, 1.15 v.p.p. The system was far lighter and used far less piezoelectric material than would a system operating at the same frequency and providing the same beam width, but constructed in accordance with the teaching of the Hands U.S. Pat. No. 3,674,945.

In view of the success of the above experiments, further tests were undertaken using plates 10 of uniform thickness as shown in FIG. 3, although for test purposes the housing 24 and its associated parts were not utilized. The effect of the seal 26 was simulated by an external cork damping ring in some tests. The actual effect of the seal 26 was also determined in subsequent tests, and whilst some loss of efficiency was noted, this was not unduly serious. This minor problem can be mitigated if desired by having the seal engage a nodal circle on the back of the disc. It was found that the use of plates 10 of uniform thickness enabled the resonant frequencies and node circle locations of the various flexural vibration modes to be calculated with a fair degree of accuracy using generally known formulae, after which optimum parameters could readily be determined by adjustment on test. It was also found that the nature of the adhesive used to secure the various rings was not critical provided that it did not introduce excessive discontinuities in the acoustic properties of the structure.

One of the objectives of the inventor was to provide a transducer system for pulse echo-ranging applications which would provide a narrow beam width and substantial acoustic power output at frequencies lower than are economically practicable with known technology such as that of U.S. Pat. No. 3,674,945. An experiment was therefore carried out using an aluminum plate 10 which was 27.3 cm in diameter and 7.6 mm thick in the system configuration shown in FIG. 3 (except as already mentioned for the housing). The assembly of the piezoelectric elements and the loading blocks, without the plate, was first adjusted to resonate at approximately the desired resonant frequency, set at 11.8 kHz for an initial experiment, in which the outermost ring 20 was omitted and the periphery of the plate 10 was undamped. The phase correcting rings 16 were of 20.6 mm thick polystyrene foam, whilst the impedance matching disc 18 and rings 20 were of 8.5 mm thick polyethylene foam, the parts being positioned so that their edges coincided with the nodal circles. After optimization of the rings it was found that the radiation pattern from the system showed a 3 dB beamwidth of 7.5°, a 12 dB beamwidth of 15°, an axial sound pressure level of 830 and side lobes more than 20 dB down. When operated in a pulse echo-ranging system, a transducer output of 1.9 v.p.p. was obtained from a hard target at a distance of 2.15 meters.

Measurements were made of the electrical impedance of the transducer system with and without the plate 10 attached, over a range of frequencies including the resonant frequency, both the reactive and resistive components being recorded in both cases. The difference between the two sets of figures represented the impedance due to the plate, which at the resonant frequency was substantial and essentially resistive in nature, amounting to about 850 ohms as compared to resistive and reactive components of respectively about 1150 ohms and −1600 ohms for the system as a whole, thus indicating substantial coupling into the medium and a low system Q.

Further experiments were carried out using a plate 20 cm in diameter and 2 mm thick, again with a similar configuration to that shown in FIG. 3 but with three rings 16, 11.5 mm thick, to suit a higher flexural mode. At an operating frequency of 22.2 kHz, the 3 db beamwidth was 7.5°, side lobes were at least 13.7 db down, and the sound pressure level was 1500. The echo output returned from a hard target at 2.15 meters was 3.3 volts peak-to-peak.

For purposes of comparison, a transducer constructed according to the teaching of the Hands U.S. Pat. No. 3,674,945, having a radiating face of 19 cm diameter and operating at 21 KHz, was tested under the same conditions. It had a 3 db beamwidth of 9°, with side lobes 12 db down. The sound output of this transducer was greater, measuring 2250 microbars, peak-to-peak. However the echo output was substantially less measuring only 1.9 volts peak-to-peak for an echo returned from a hard target at 2.15 meters. Further, such a transducer utilizes 8.4 Kg of piezoelectric material while only 70 g of piezoelectric material were used in the test transducer.

In another test a tranducer with a 14 cm diameter plate 4.9 mm thick and a similar configuration to that shown in FIG. 3, operating at 21.5 KHz, exhibited a 3 db beamwidth of 8° with side lobes 14 db down and a sound pressure output of 1600 microbars peak-to-peak.

In view of the very great increases in coupling efficiency obtained with the embodiments already described, and the quite good results obtained with the embodiment of FIG. 1 with only the ring 16 applied, further experiments were carried out with transducers in which the rings 18 and 20 were omitted. In order to reduce the development of unwanted side lobes in the radiation pattern, even higher order resonance modes were tried out in order to increase the number of nodal circles, operation in such modes enabling use of a thinner disc to obtain resonance at a desired frequency in a given size of disc. Such a modified transducer is shown in axial cross-section in FIG. 4, in which similar reference numerals to those used in FIG. 3 are used to designate similar parts. Only the points of difference will be described in detail.

The plate 10 is considerably thinner than that shown in FIG. 3, the edge grommet 26 and felt seal 28 of FIG. 3 being omitted. The rings 18 and 20 are also omitted, whilst the rings 16 are applied to alternate antinodal zones of the plate. Although in the embodiment shown, the even numbered zones (counting from the centre) are shown covered by rings 16, the opposite arrangement has also been used. However, it is preferred that the arrangement be such that the outermost full zone is covered, in the interests of ensuring as high a ratio as reasonably practicable of covered to uncovered area of the plate. In the embodiment shown there are ten antinodal zones and five rings 16 but this number may be varied provided that any required degree of side lobe suppression can be obtained. The thickness of the rings 16 relative to their material is chosen as discussed elsewhere so as to provide optimum matching of the radiating surface of the plate to the gaseous medium, usually air, into which it radiates.

Figure 4:
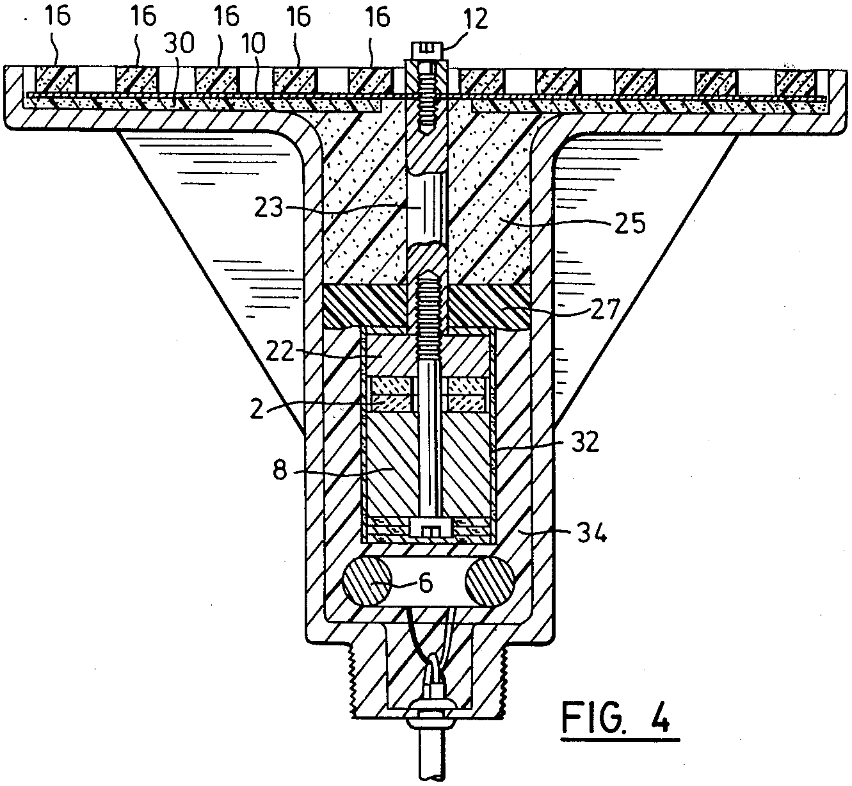
FIG. 4 is an axial section through a third embodiment of the invention.

In the embodiment of FIG. 4, a somewhat different driving connection is employed between the tranducer elements 2 and the plate 10. The loading block 22 is coupled to the plate through a post 23. A filling 25 of foam, either chips or formed in situ, is used to prevent reflections within the housing cavity, being separated from the potting compound 34 by a cast-in-place polyurethane sealing membrane 27.

Transducers constructed in accordance with the embodiment of FIG. 4 were tested under the same conditions as those previously set forth in relation to the embodiments of FIGS. 1 to 3.

A transducer was constructed in accordance with FIG. 4 using a plate 10, 24 cm in diameter and 1.3 mm in thickness, made of grade 6061-T6 aluminum. The rings 16 were of low-density closed-cell polyethylene foam having a density of 0.025 gm/cc, and were 5.3 mm thick which is one guarter wavelength of sound in the material at 21 kHz, the operating frequency of the transducer. The driver assembly of tranducer elements, loading blocks and post was adjusted to resonate at this frequency. After optimization of the placement of the rings 16 it was found that the radiation pattern of the system at a test frequency of 21.0 kHz showed a 3 db beamwidth of 4.9°, a 12 db beamwidth of 8.3°, an axial sound pressure level of 3000 and side lobes at least 18 db down. When operated in a pulse echo-ranging system, a tranducer output of 5.5 v.p.p. was obtained from a hard target at a distance of 2.25 meters. The 3 db bandwidth of the echo-ranging system was 1.9 kHz, corresponding to a system (two-way) Q of 11.2. It was found that an even broader bandwidth could be obtained by offsetting the resonant frequency of the disc from that of the driver assembly, a 1.2 KHz offset of the disc resonant frequency providing a corresponding increase in bandwidth.

A further transducer was constructed for an operating frequency of 13 kHz in which the plate diameter was increased to 33 cm, and the thickness of the rings 16 increased to 7.6 mm to provide guarter wavelength matching. In this case the plate had 11 antinodal zones, the odd numbered zones counting from the centre being covered by rings 16. At a test frequency of 13.03 kHz the radiation pattern of the system showed a 3 db beamwidth of 4.9°, a 12 db beamwidth of 9.1°, side lobes at least 15 db down, and an axial sound pressure level of 5600. When operated in a pulse echo-ranging system, a transducer output of 14.6 v.p.p. was obtained from a hard target at a distance of 2.25 meters. The 3 db bandwidth of the echo-ranging system was 1 kHz, corresponding to a system Q of about 13.

It will be apparent from the above test results that even higher outputs can be obtained from transducers in accordance with FIG. 4 despite the simplified ring system, and despite the fact that the mass of the transducer elements in the experimental transducers was still further reduced relative to those constructed and tested in accordance with FIGS. 2 and 3. In the FIG. 4 embodiment, no attempt is made to reverse the phase of sound radiated from alternate antinodal zones so as by this means to prevent cancellation in the far field. Instead, cancellation in the far field is prevented by making the output of sound radiated from alternate antinodal zones negligible compared with that from the intervening zones. The mismatch between the plate and the medium in those zones which do not carry rings 16 is so great that very little energy is radiated, whilst the rings 16 are efficient radiators; consequently, there is no substantial cancellation of energy radiated from the latter on the axis of the transducer. However, interference between the radiation from different rings 16 prevents the development of substantial side lobes in the radiation pattern. Although the effective radiating area of the plate is reduced in proportion to the area not covered by the rings 16, the examples show that this can readily be compensated for merely by increasing the size of the plate so that the proportion of the plate energy transferred to the medium in each vibratory cycle may actually be increased.

One disadvantage of prior art transducers such as that of the Hands U.S. Pat. No. 3,674,945 is that their performance can be drastically impaired by the deposition of condensation or other liquid or greasy material on their radiating surface. This is because the mass of the deposited material loads the matching material and alters its tuning, thus greatly reducing or completely destroying its effectiveness until the deposited material evaporates or is otherwise removed. A similar impairment also occurs with transducers constructed in accordance with the FIGS. 2 and 3 embodiment of the present invention. With FIG. 4 embodiment, however, it was found that the impairment was much less severe, and that the transducer would operate satisfactorily, albeit at reduced output, even when its radiating surface was sprayed with water. It is believed that this surprising result is occasioned by a change in the relative functions of the two sets of antinodal zones. The water loads the matching rings 16 thus detuning them and impairing their matching function. They still act however to phase-shift the sound radiated from the zones they cover relative to that from the uncovered zones, which latter radiation becomes significant as that from the rings 16 is reduced. The phase shift is due both to the differential sonic velocity in the ring material relative to air, and to the reactive characteristic of the detuned matching section. The result of the phase shift is that the sound radiated from adjacent zones is approximately in quadrature rather than in phase opposition with the consequence that mutual cancellation is greatly reduced, and a significant output is retained. This theory of operation was tested by gradually wetting the transducer radiating surface whilst measuring its output. Although the output decreased with increasing application of moisture, no zero or minimum was noted. Although the matching provided by the rings 16 is lost, enhanced coupling to the medium can still be obtained because of the large radiating surface relative to the effective area of the transducer element which is permitted by the invention. This in itself effectively provides a substantial degree of impedance transformation.

A transducer of reduced sensitivity to moisture could be provided by deliberately detuning the matching rings 16 sufficiently that the application of moisture, dirt or other surface loading will not very greatly change the phase shift applied by the rings to the radiated sound or their radiating efficiency. Such an arrangement would not normally be advantageous, since it would not improve the output of the system in moist conditions. Another approach which was tested was to make the rings of lossy material so that radiation therefrom was substantially reduced as compared with the uncovered antinodal zones. This again sacrifices the matching which can be provided by the rings, but also reduces the efficiency of the system since the rings will absorb a substantial portion of the energy applied to the plate. It was not found that results with such an arrangement were satisfactory. Reasons were its low efficiency and the difficulty of providing effective sound absorbtion in a small thickness of material. A further disadvantage is that, if effective absorbtion is obtained, the surface of the rings is stationary and there is loss of the acoustic self-cleansing property which is manifest in transducers according to the invention. For similar reasons, where rings 16 of low loss material are applied to alternate antinodal zones, it is not believed particularly advantageous to apply sound absorbing material to the intervening zones.

Instead of or additional to the thickness of material applied to alternate antinodal zones in the embodiment of FIG. 4 being such as to provide otpimum impedance matching, it may be selected to provide approximately 180° phase shift, thus avoiding cancellation in the axial far field. Numerous further experiments have been carried out, some using different materials, including synthetic plastic material for the plate 10, and for the rings 16, 18, 20. The suitability of materials for these rings may be determined by the same criteria as are discussed in detail in respect of the impedance matching layers used in the system of the Hands U.S. Pat. No. 3,674,945. The requirements of materials for the plate 10 are high impedance, low mechanical losses during vibration, and high elastic modulus. A plate 10 of a uniform thickness which is small compared to its diameter will behave at resonance in the system just described as an effectively massless body so far as the drive system is concerned, enabling the plate and the transducer elements to be tuned independently. As well as assisting in the design of systems, this feature provides the possibility of stagger-tuning the drive system and the transducer elements so as further to broaden the bandwidth of the transducer system as a whole. Plates having a diameter/-thickness ratio of between 25:1 and approximately 500:1 have been found to give good results but this range should not be regarded as limiting. Plates in which the ratio is large are are usually preferred, since the spacing between the nodal circles is reduced, thus permitting use of a higher order resonance for a given plate diameter. A larger number of nodal rings will facilitate the avoidance of unwanted side lobes in the transducer response. The FIGS. 2 and 3 embodiment has three nodal rings although more are desirable and the FIG. 4 embodiment has 10. The experimental results obtained indicate that similar results would be obtained with non-circular plates operating in symmetrical or asymmetrical flexural modes provided that the correction material is applied in accordance with the same principles, although the various zones of material in such cases will not necessarily be ring shaped since their boundaries will be determined by the lines followed by the nodes on the plate. While the plate must have a radiating surface which is larged compared with the transducer for the advantages of the invention to be realized, the principles of the invention allow enlargement of the plate to a degree which enables greatly improved coupling to the medium to be achieved even without the matching technique of U.S. Pat. No. 3,674,945 being utilized, since the plate itself acts as an impedance transformer by increasing the area of contact with the propagation medium.

It has been found that a wide range of elastic materials may be used for the rings 16, 18 and 20. Successful tests have been performed with materials ranging from polystyrene foam with a density only 1.2% of that of the plate material to solid polyurethane elastomer having a density 43% of that of the plate material. This latter material results in slightly lower efficiencies and also has a greater effect on the resonant frequency of the plate because of its greater total mass. On the other hand its use facilitates manufacture and may provide greater ruggedness. It also has the advantage that the difference in the velocity of propagation of sound through it as compared to the rate of propagation in air is greater than is the case with the foamed materials tested, so that phase correction can be achieved with rings of quite small thickness. It also exhibits a very low hysteresis at the frequencies of interest.

It will of course be appreciated that the suitability of a material for use in the rings 16, 18 and 20 will depend on its properties as a low-loss acoustic propagation medium at the operating frequency of the system, and the relationship of its acoustic impedance to that of the plate and the gaseous medium. Ideally, the ratio of the acoustic impedance of the plate material to that of the rings should be of the same order as the ratio of that of the ring material to that of the gaseous medium, but a less than ideal relationship may be compensated for by other properties of the ring material. Thus if the plate is aluminum, the gaseous medium is air and the ring material is polystyrene foam, the ratios defined above are about 400 and about 85 respectively, whereas when the ring material is solid polyurethane elastomer, they become about 8 and about 4000 respectively. The material should not exhibit substantial hysteresis in the propagation of acoustic waves at the operating frequency since this will prevent proper operation and reduce efficiency. Materials with small closed cells appear to provide the best results amongst foamed materials.

If the mass of the material forming the rings 16, 18 and 20 is appreciable relative to the mass of the plate, the resonant frequency of the latter will be shifted significantly, and due allowance must of course be made for this.

The various rings have been described as being separately formed but it is clear that, when rings are applied to adjacent antinodal zones and particularly when they are all formed of the same material, they could be formed as a single integrated moulding. Moreover, whilst in the embodiments described with reference to FIGS. 1—3, the total thickness of material applied over adjacent antinodal zones of the plate is shown as alternating up and down, this need not be the case provided that the thicknesses comply with the requirements to be discussed below.

As is discussed in U.S. Pat. No. 3,674,945, material used for matching purposes should be an odd number of quarter wavelengths thick. In those embodiments of the transducer in which adjacent antinodal zones are to be matched to the medium, alternate antinodal zones also require to be covered with material (which need not be the same material) to an additional thickness providing approximately 180° phase shift as compared with sound passing through an equivalent thickness of air (or whatever other gaseous medium may be involved). This thickness can be shown to be $n/2f(1/C_0-1/C_1)$ where n is an odd integer, f is the frequency of operation, $C_0$ is the speed of sound in air and $C_1$ is the speed of sound in the material used. If this thickness can be selected so as also to meet the matching requirement, so much the better. Clearly there should be a significant difference between $C_0$ and $C_1$ to keep the thickness reasonably small. It should be understood that experiment will usually be necessary to optimize the thickness of the material applied to the plate since the velocity of sound, particularly in foamed material, is inter alia a function of the frequency of operation and the configuration and sometimes the orientation of the material.

Since the phase correction and matching material (the rings 16, 18, 20 in the embodiments described) are of low density material of lower acoustic impedance than the plate they usually add little mass or stiffness to the latter and thus have relatively little effect on its resonant frequency. This permits a relatively thin disc to be used so that its surface area is very large compared to its volume and thus to the energy stored within in the disc. Since the rate of transfer of energy from the plate to the surrounding medium is proportional to the area of the radiating surface, the proportion of the energy stored within the plate that is transferred to the medium during each cycle is increased, and the Q of the system is thus decreased. Moreover, since the ratio of the area of the plate to the effective area of the transducer element or elements is very large, a much smaller transducer element may be used to achieve a given transfer of energy. Thus the transducer element utilized in the various experiments described typically contain about 70-150 gm lead zirconate titanate, whereas a 10 kHz transducer of comparable performance constructed in accordance with U.S. Pat. No. 3,674,945 would probably require of the order of 50 kilograms of expensive piezoelectric material and have a lower efficiency.

Whilst in prior art transducers such as those in accordance with U.S. Pat. No. 3,674,945 it has been usual to employ barium titanate as the piezoelectric material, it is an advantage of the present invention that it is possible to utilize lead zirconate titanate transducer elements which have somewhat superior performance. The latter material can readily be fabricated into annular elements suitable for use in the present invention, but is not readily fabricated into elements suitable for use in transducers such as that of U.S. Pat. No. 3,674,945.

The coupling between the transducer elements and the vibrating plate may be modified in various ways. As already described with reference to FIG. 4, good results have been obtained with an arrangement in which the transducer elements are mounted between identical loading blocks and the assembly is coupled to the plate by a short post, one end of which is attached to the assembly and the other to the plate. This post could also be replaced by a mechanical amplifier such as that described by Gallego-Juarez et al. in the November 1978 issue of Ultrasonics at page 268.

Although all of the embodiments specifically described relate to arrangements in which the edges of the plate are essentially free, it is of course possible to use a plate which is clamped or otherwise fixed at its periphery, in which case a nodal circle will coincide with the periphery of the plate. Such an arrangement may be advantageous in some cases, particularly when it is desired to provide a flameproof system for use in environments presenting a fire or explosion hazard.

The term "higher order flexural mode resonance" used in this specification and the appended claims is to be taken to include any form of flexural mode resonance of a plate which gives rise to at least two antinodal zones separated by a node and radiating (in the absence of the modification) in antiphase to one another.

What I claim is:

1. A broadly tuned directional transducer system comprising a plate having a radiating surface and a higher flexural mode resonance at substantially the operating frequency of the system, and a transducer element of much smaller effective area than the radiating surface of the plate and connected thereto for excitation or response to said higher flexural mode resonance, wherein at least alternate antinodal zones of the radiating surfaces of the plate are coupled to a gaseous propagation medium by coupling means formed of low-loss acoustic propagation material of much lower acoustic impedance than the plate and applied at least to said alternate antinodal zones of the radiating surface thereof in a thickness selected to differentiate at least one of the relative phase and the relative amplitude of the radiation from adjacent antinodal zones sufficiently to reduced substantially mutual cancellation, in the far field and in the desired direction of radiation, of sound radiated into said medium from adjacent antinodal zones of the plate.

2. A system according to claim 1, wherein the thickness of low-loss acoustic propagation material applied to said alternate zones is an odd number of quarter-wavelengths of sound in the material at the operating frequency of the system, and no such material is applied to the remaining zones.

3. A system according to claim 1, wherein the thickness of low-loss acoustic propagation material applied to said alternate zones differs from that applied to the remaining zones by an amount such that the sound reaching the far field from said alternate zones undergoes a phase shift, compared with that radiated from the remaining zones, sufficient substantially to reduce cancellation.

4. A system according to claim 1, 2 or 3, wherein the plate is axisymmetrically resonant and axisymmetrically coupled to the transducer element.

5. A system according to claim 1, 2, or 3 wherein the plate is a disc of uniform thickness, and both the plate and the transducer element are tuned to resonant frequencies close to the operating frequency of the system.

6. A system according to claim 1, 2 or 3, wherein the plate is a disc of uniform thickness and the ratio of plate diameter to thickness is between 25:1 and 500:1.

7. A system according to claim 3, wherein each antinodal zone of the plate is covered with said material to a thickness which differs by $n/2f(1/C_0-1/C_1)$ from that covering the next zone, where n is an odd integer, f is the frequency of operation of the system, $C_0$ is the velocity of sound in the gaseous medium, and $C_1$ is the velocity of sound in the material.

8. A system according to claim 3 or 7, wherein at least some of the antinodal zones of the plate are covered with low-loss, acoustic impedance matching material to a thickness equal to an odd number of quarter wavelengths of sound at the velocity of sound in said matching material.

9. A system according to claim 1, 2 or 3, wherein the low-loss acoustic propagation material is selected from closed-cell foamed synthetic plastics and unfoamed elastomers.

10. A system according to claim 1, 2 or 3, wherein the plate is a disc having at least three nodal rings.

11. A tuned directional acoustic transducer system comprising a plate exhibiting a high acoustic impedance and a flexural mode resonance at substantially the operating frequency of the system, a high impedance acoustic transducer element, a mechanical coupling between said transducer element and an antinodal zone of said plate so that flexural resonance of said plate occurs conjointly with mechanical deformation of the transducer element at the same frequency, one surface of said plate facing into a propagation medium and being covered at least in part with a low hysteresis acoustic propagation material having an acoustic impedance much lower than that of the plate and much higher than that of the gaseous medium, the thickness of said material in different antinodal zones varying such that acoustic waves radiated in antiphase from adjacent antinodal zones of the plate reach the far field in the gaseous medium substantially in phase with one another on a plane wavefront.

12. A system according to claim 11, wherein the plate is axisymmetrically resonant and axisymmetrically coupled to the transducer element.

13. A system according to claim 12, wherein the plate is disc shaped.

14. A system according to claim 13, wherein the plate is of uniform thickness, and both the plate and the transducer element are tuned to the same resonant frequency.

15. A system according to claim 11, wherein each antinodal zone of the plate is covered with said material to a thickness which differs by $n/2f(1C_0-1/C_1)$ from that covering the next zone, where n is an odd integer, f is the frequency of operation of the system, $C_0$ is the velocity of sound in the gaseous medium, and $C_1$ is the velocity of sound in the material.

16. A system according to claim 11, wherein at least some of the antinodal zones are covered with additional low-loss, low acoustic impedance matching material to a thickness equal to an odd number of quarter wavelengths of sound at the velocity of sound in said matching material.

17. A system according to claim 15 or 16, wherein the plate is disc shaped.

18. A system according to claim 15 or 16, wherein the material is selected from closed-cell foamed synthetic plastics and unfoamed elastomers.

19. A system according to claim 11, wherein the area of the radiating surface of the plate is very large compared to the effective surface area of the transducer element.

20. A broadly tuned directional transducer system comprising a radiating plate having a flexural mode resonance at substantially the operating frequency of the system, a transducer element of much smaller effective area than the plate and coupled thereto, and phase correcting means formed of layers of low-loss acoustic propagation material of much lower acoustic impedance than the plate and applied to selected portions of the radiating surface thereof such as to equalize the phase in the far field of sound radiated from different antinodal zones of the plate.

21. A transducer system according to claim 20, further comprising impedance matching means applied to the radiating surface of the plate including said phase correction means and comprising a layer of low-loss acoustic propagation material of lower acoustic impedance than said plate and of a thickness equal to an odd number of quarter wavelengths of sound of the operating frequency in said material.

22. A tuned directional acoustic transducer system comprising a plate exhibiting a high acoustic impedance and a higher order flexural mode resonance at substantially the operating frequency of the system, a high impedance acoustic transducer element, a mechanical coupling between said transducer element and an antinodal zone of said plate so that flexural resonance of said plate occurs conjointly with mechanical deformation of the transducer element at the same frequency, one surface of said plate facing into a propagation medium and being covered at least over alternate antinodal zones with a low hysteresis acoustic propagation material having an acoustic impedance much lower than that of the plate and much higher than that of the gaseous medium, the disposition of said material in respect of different antinodal zones of the plate being such that acoustic waves radiated from said one surface of the plate reach the far field in the gaseous medium without substantial mutual cancellation and on a plane wave front.

23. A system according to claim 22, wherein the plate is axisymmetrically resonant and axisymmetrically coupled to the transducer element.

24. A system according to claim 23, wherein the plate is disc shaped.

25. A broadly tuned directional transducer system comprising a radiating plate having a higher flexural mode resonance at substantially the operating frequency of the system, a transducer element of much smaller effective area than the plate and coupled thereto, and coupling means formed of low-loss acoustic propagation material of much lower acoustic impedance than the plate and applied to alternate antinodal zones of the radiating surface thereof such as to avoid substantial cancellation in the far field of sound radiated from said alternate antinodal zones of the plate by sound radiated from the remaining antinodal zones of the plate.

* * * * *